United States Patent
Aiso et al.

(10) Patent No.: US 10,669,621 B2
(45) Date of Patent: Jun. 2, 2020

(54) VAPORIZATION SYSTEM

(71) Applicant: TOSHIBA MEMORY CORPORATION, Minato-ku (JP)

(72) Inventors: Fumiki Aiso, Kuwana (JP); Hajime Nagano, Yokkaichi (JP); Kensei Takahashi, Kuwana (JP); Tomohisa Iino, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 88 days.

(21) Appl. No.: 15/430,809

(22) Filed: Feb. 13, 2017

(65) Prior Publication Data
US 2018/0057926 A1    Mar. 1, 2018

(30) Foreign Application Priority Data

Aug. 24, 2016    (JP) ................. 2016-163976

(51) Int. Cl.
| | |
|---|---|
| C23C 16/00 | (2006.01) |
| C23C 14/24 | (2006.01) |
| C23C 14/54 | (2006.01) |
| G01N 21/17 | (2006.01) |

(52) U.S. Cl.
CPC .......... *C23C 14/243* (2013.01); *C23C 14/246* (2013.01); *C23C 14/54* (2013.01); *G01N 21/17* (2013.01)

(58) Field of Classification Search
CPC ............................ C23C 14/246; C23C 14/243
See application file for complete search history.

(56) References Cited

U.S. PATENT DOCUMENTS

| | | | | |
|---|---|---|---|---|
| 3,088,850 A | * | 5/1963 | Brichard ................. | C03C 17/23 118/314 |
| 3,563,202 A | * | 2/1971 | Mackrael .............. | C23C 14/246 118/718 |
| 4,016,310 A | * | 4/1977 | Ing .......................... | C23C 14/24 427/251 |
| 4,242,982 A | * | 1/1981 | Drake .................... | B22F 1/025 118/716 |

(Continued)

FOREIGN PATENT DOCUMENTS

| | | |
|---|---|---|
| JP | 10-18035 A | 1/1998 |
| JP | 2007-2314 A | 1/2007 |

(Continued)

*Primary Examiner* — Keath T Chen
(74) *Attorney, Agent, or Firm* — Oblon, McClelland, Maier & Neustadt, L.L.P.

(57) ABSTRACT

According to the embodiment, a vaporization system includes a vaporizer, a body, a sensor, a moving mechanism, and a supplier. The vaporizer includes a plurality of containers which can store powdered solid materials. The body in a vacuum state can house the vaporizer. The sensor detects a residue of the solid materials stored in a plurality of the containers respectively. The moving mechanism, on the basis of a detection result of the sensor, moves the plurality of the containers respectively between a first position located inside the vaporizer, and a second position located outside of the vaporizer. A supplier supplies the solid material to the container located in the second position among the plurality of the containers.

4 Claims, 10 Drawing Sheets

(56) References Cited

U.S. PATENT DOCUMENTS

| | | | | |
|---|---|---|---|---|
| 4,817,557 A | * | 4/1989 | Diem | C23C 16/54 118/719 |
| 6,241,858 B1 | * | 6/2001 | Phillips | C09C 1/0021 118/716 |
| 6,589,351 B1 | * | 7/2003 | Bruce | C23C 14/246 118/723 EB |
| 7,459,396 B2 | | 12/2008 | Suzuki et al. | |
| 8,268,078 B2 | | 9/2012 | Suzuki et al. | |
| 2005/0241585 A1 | * | 11/2005 | Cok | C23C 14/12 118/726 |
| 2007/0237895 A1 | | 10/2007 | Suzuki et al. | |
| 2009/0061090 A1 | * | 3/2009 | Negishi | C23C 14/12 427/255.28 |
| 2009/0181168 A1 | * | 7/2009 | Chaubey | C23C 16/4481 427/248.1 |
| 2010/0154712 A1 | * | 6/2010 | Tamura | C23C 14/243 118/726 |
| 2010/0173067 A1 | * | 7/2010 | Ukigaya | C23C 14/12 427/66 |
| 2012/0027921 A1 | * | 2/2012 | Feldman-Peabody | C23C 14/0629 427/74 |
| 2012/0048192 A1 | * | 3/2012 | Little | C23C 14/0629 118/694 |
| 2012/0082778 A1 | * | 4/2012 | Shimada | C23C 14/14 427/78 |
| 2013/0269613 A1 | * | 10/2013 | Sanchez | H01L 21/02104 118/724 |
| 2015/0191819 A1 | * | 7/2015 | Hendrix | C23C 16/4402 118/728 |
| 2017/0211173 A1 | * | 7/2017 | Zhao | C23C 14/12 |

FOREIGN PATENT DOCUMENTS

| | | |
|---|---|---|
| JP | 2007-270355 | 10/2007 |
| JP | 2008-522033 | 6/2008 |
| JP | 2009-530494 | 8/2009 |
| WO | WO 2007/135870 A1 | 11/2007 |

* cited by examiner

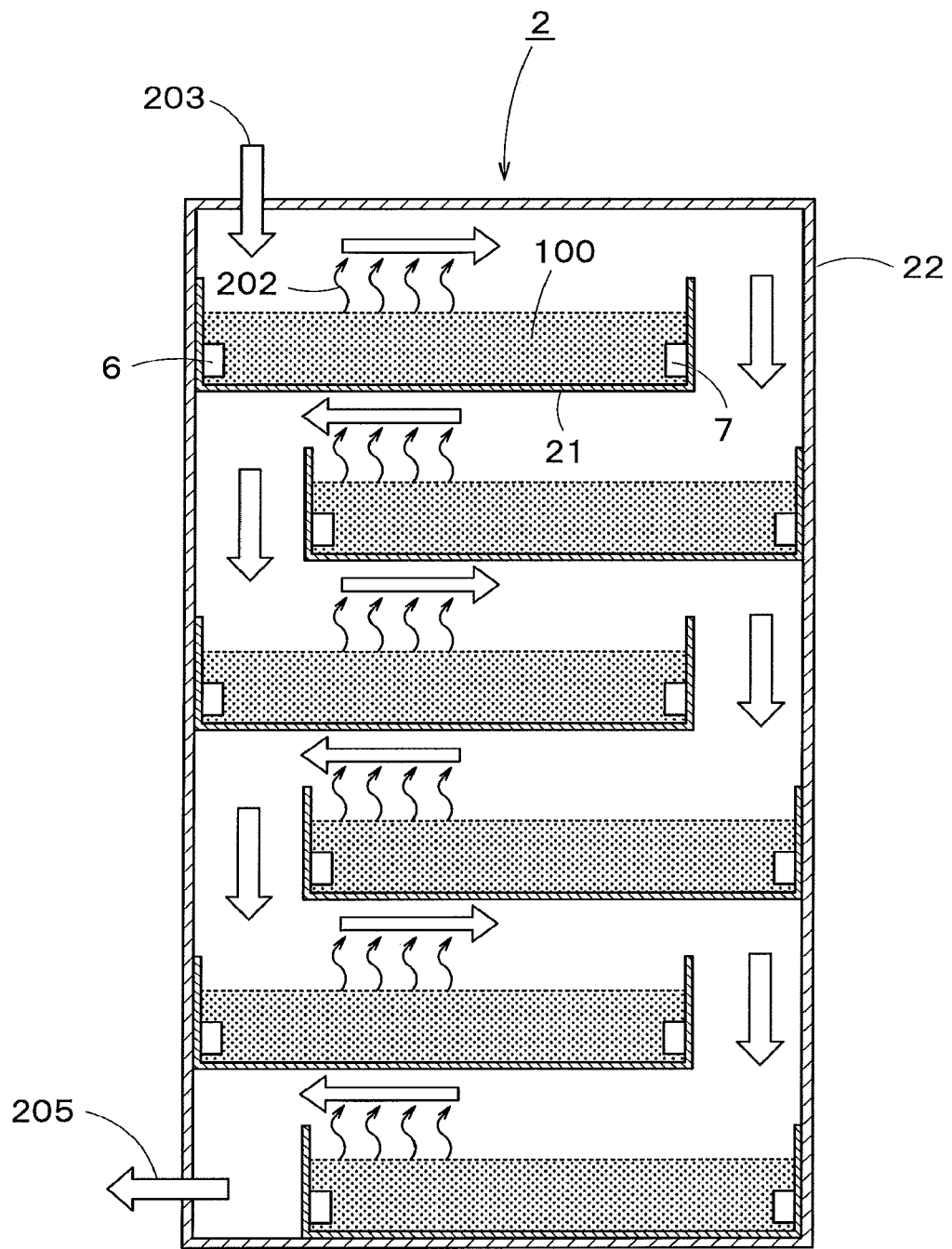
F I G. 2

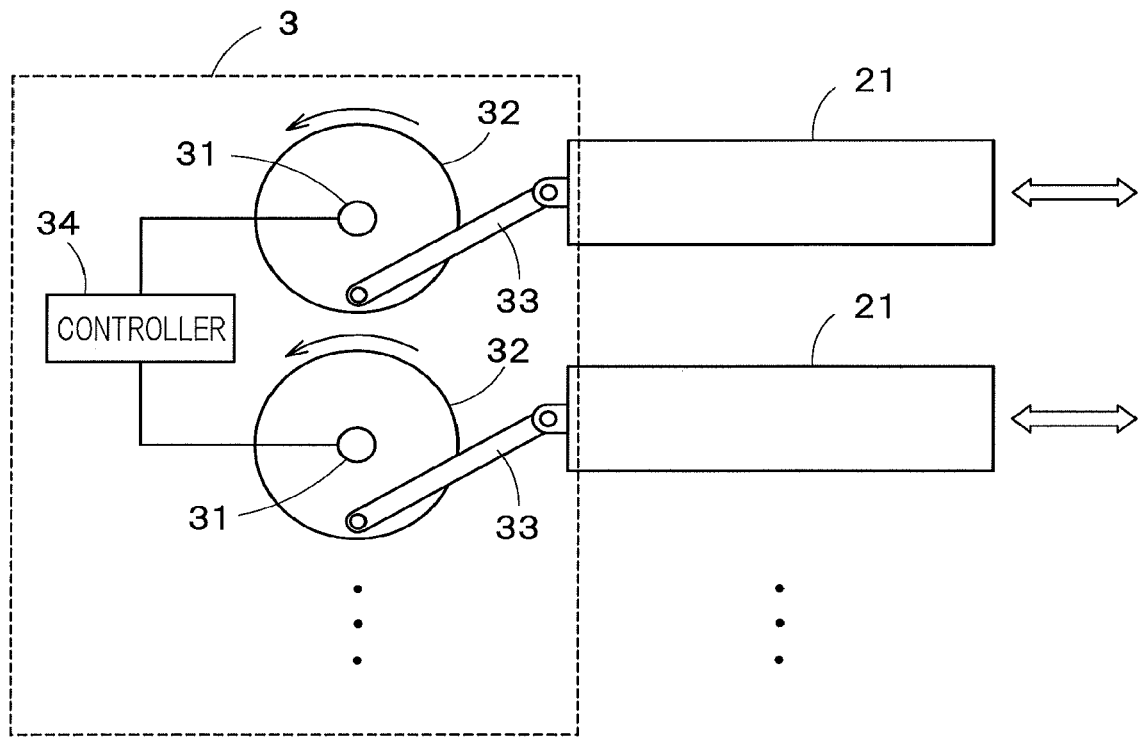
F I G. 3
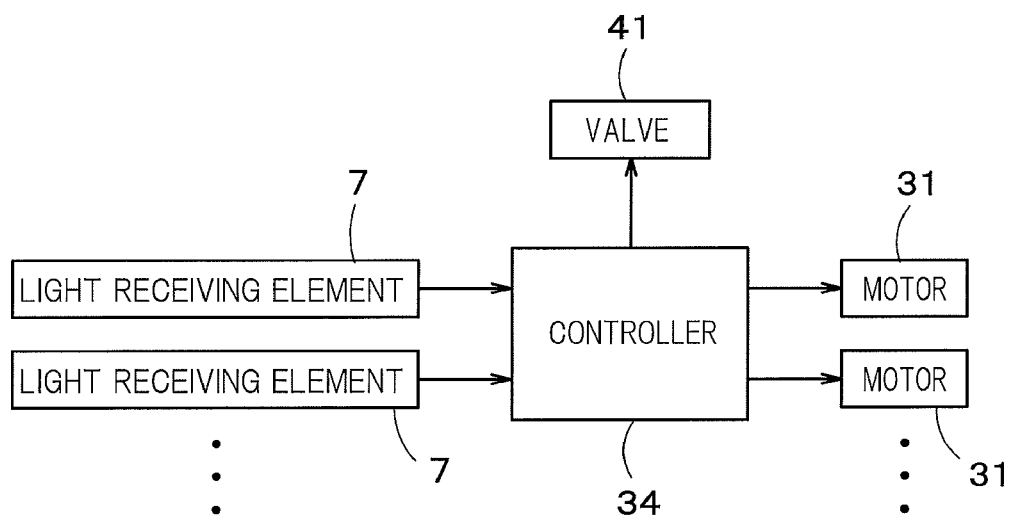
F I G. 4

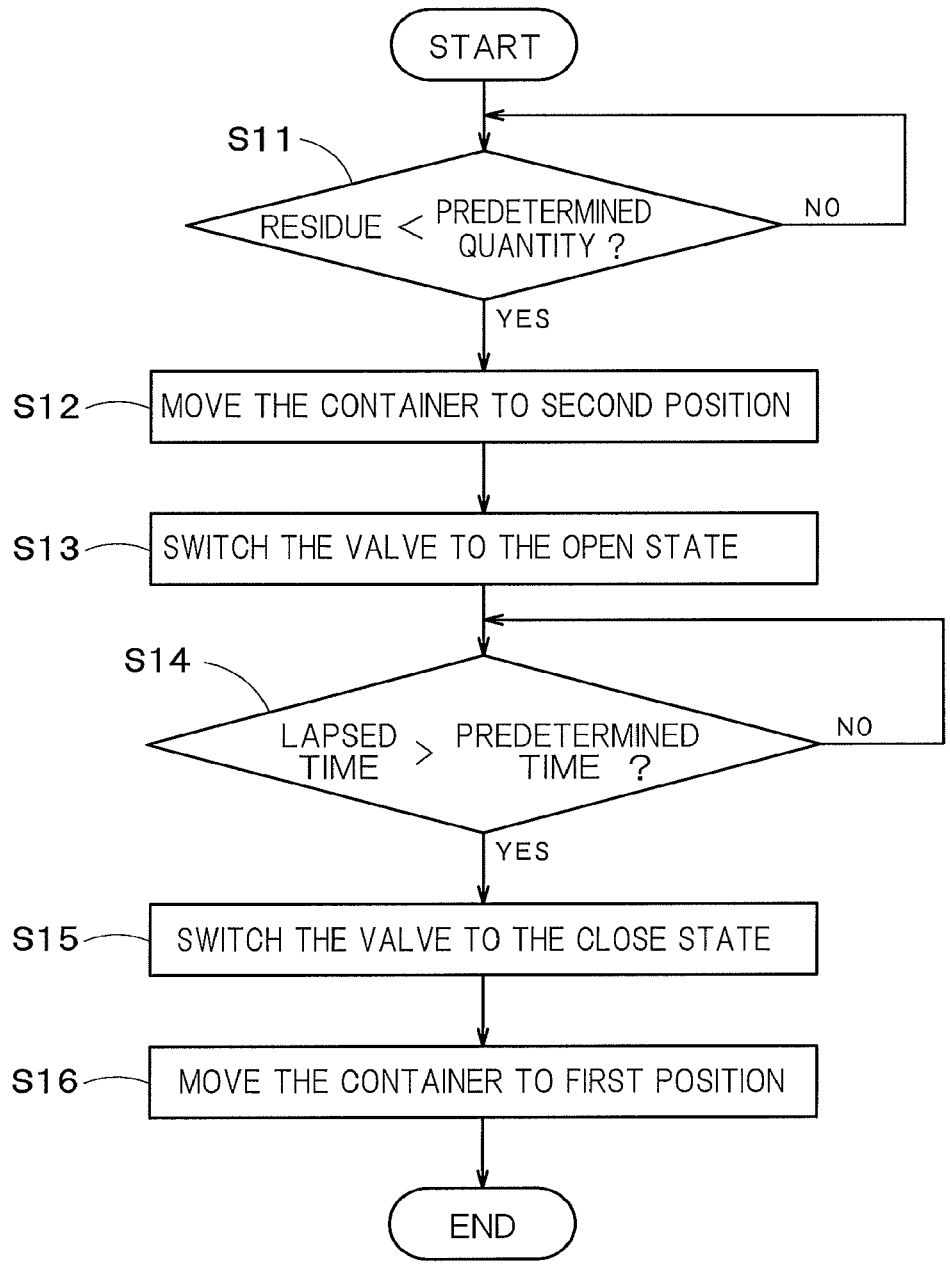
F I G. 5

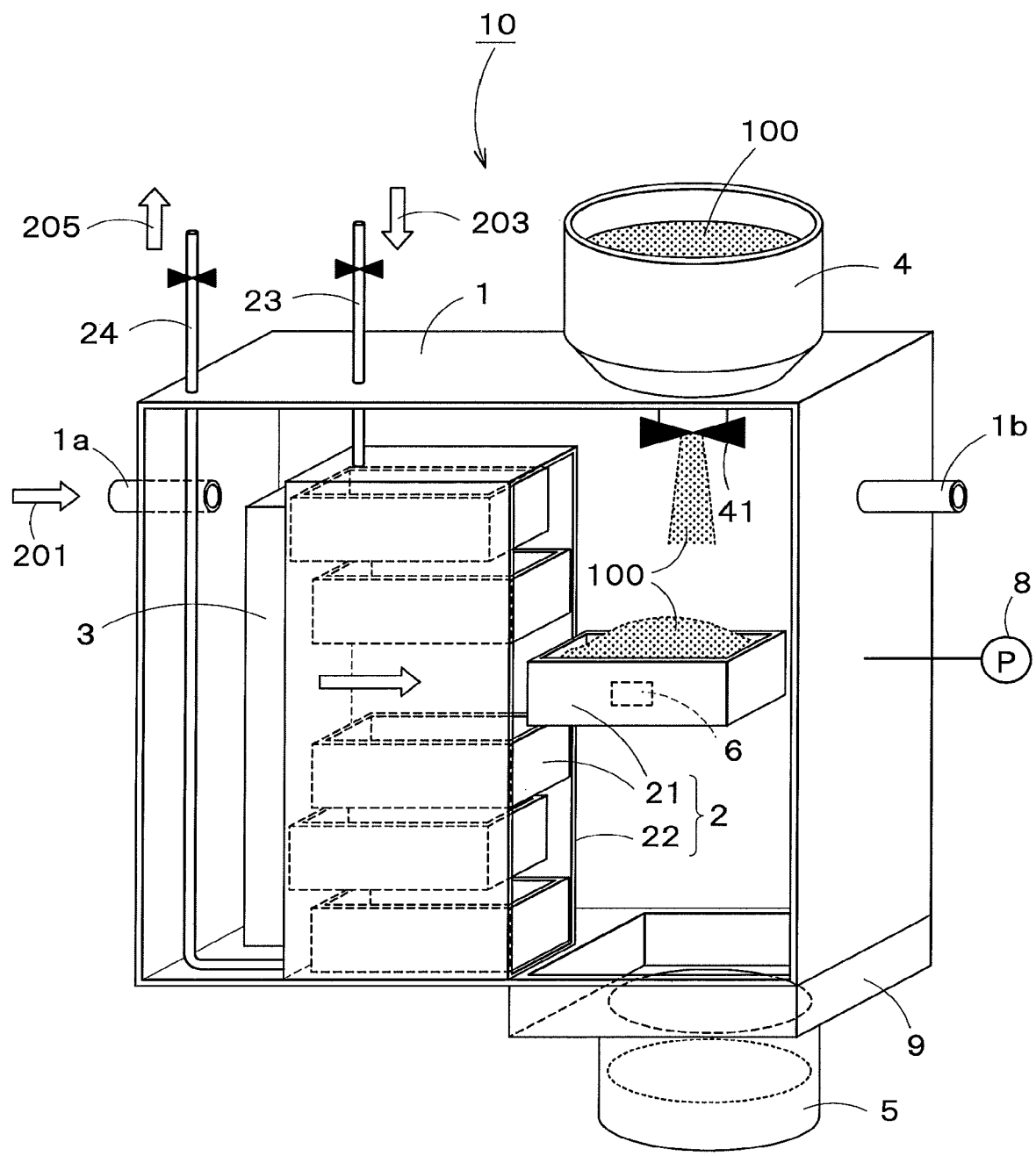
F I G. 6

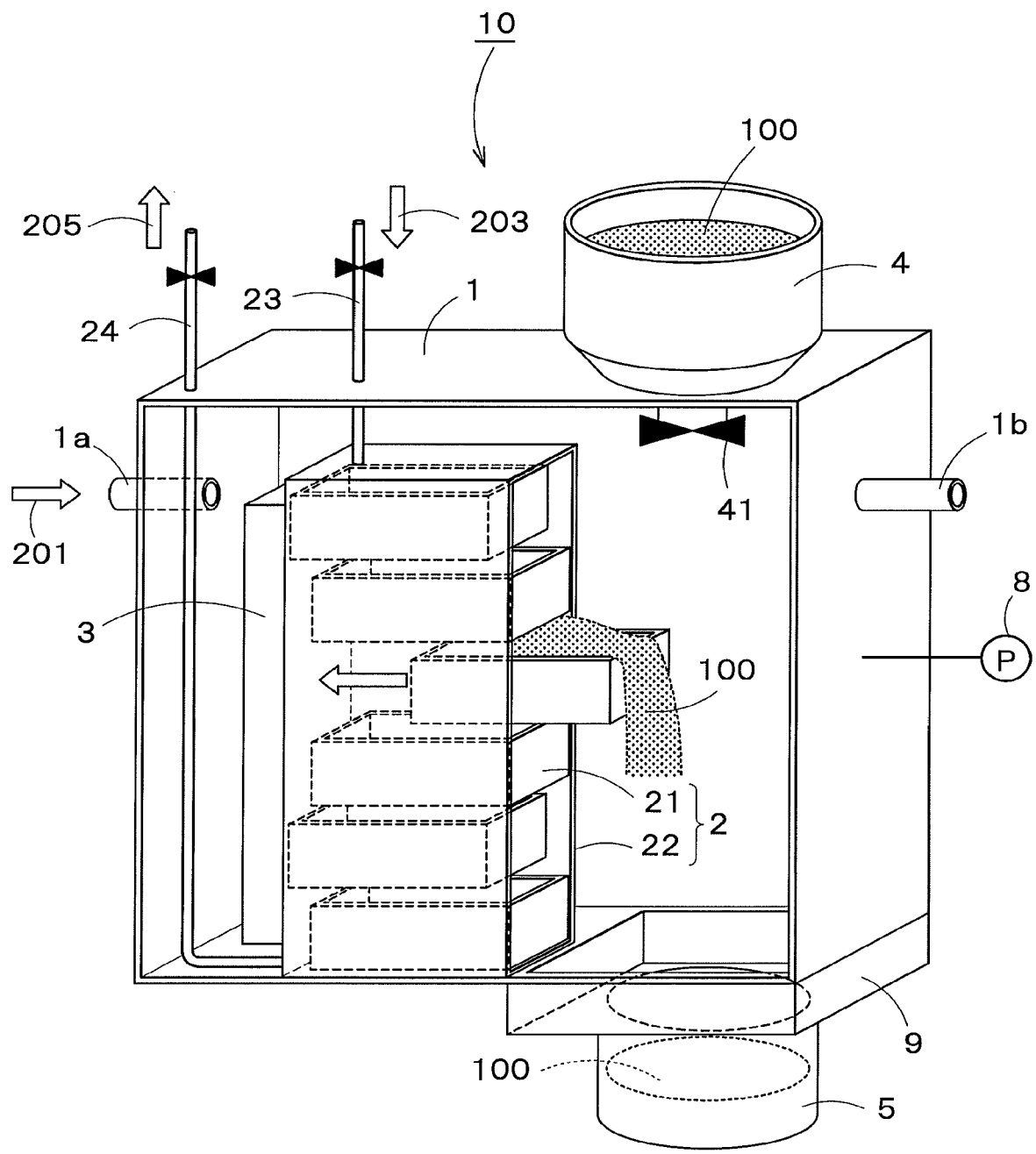
F I G. 7

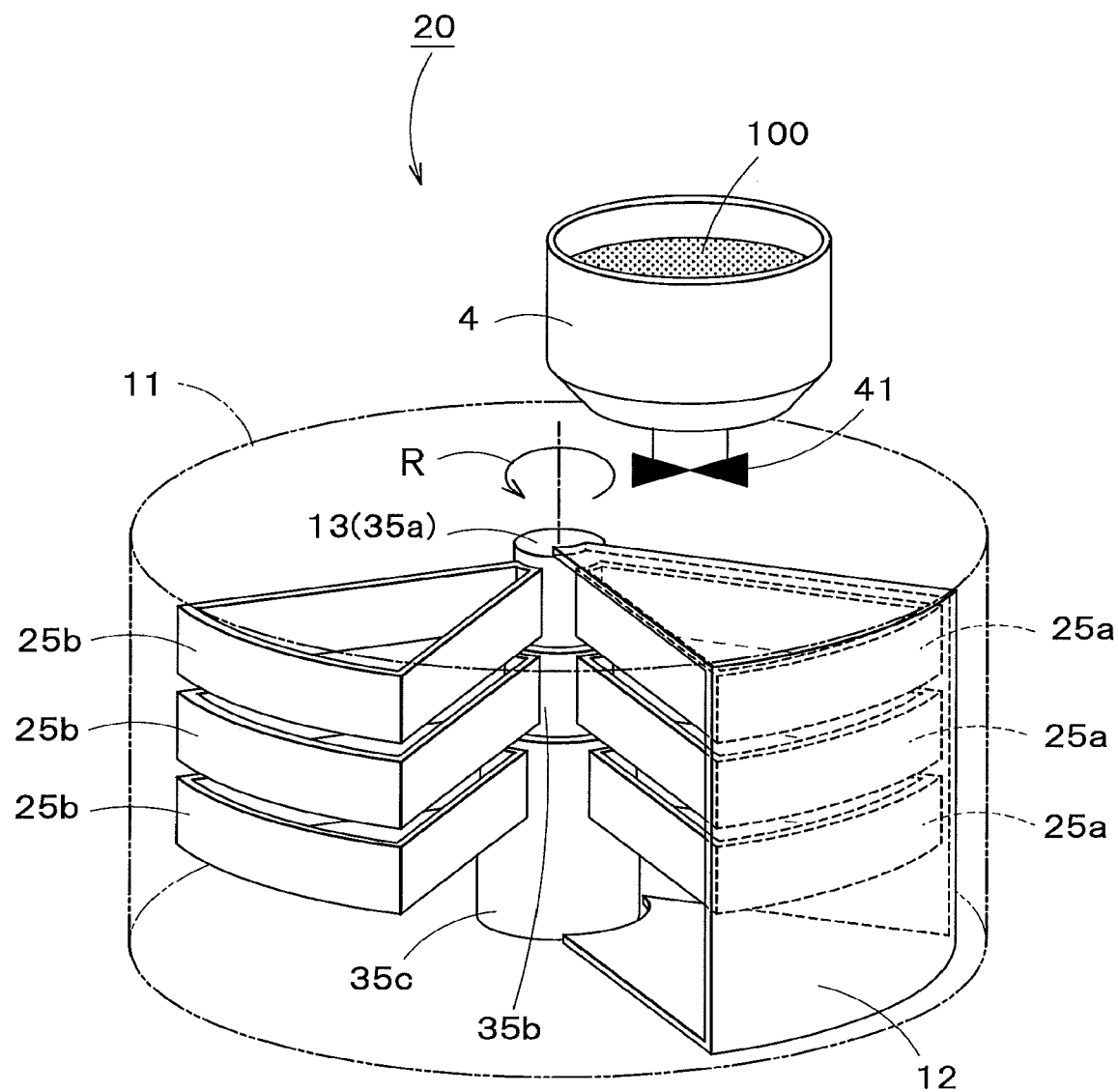
F I G. 9

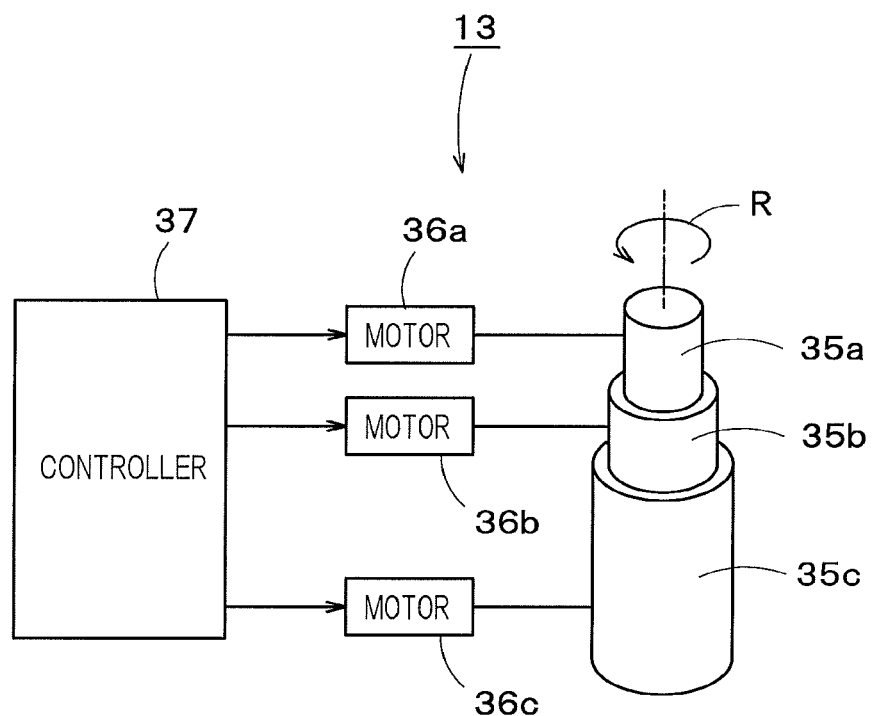
F I G. 10

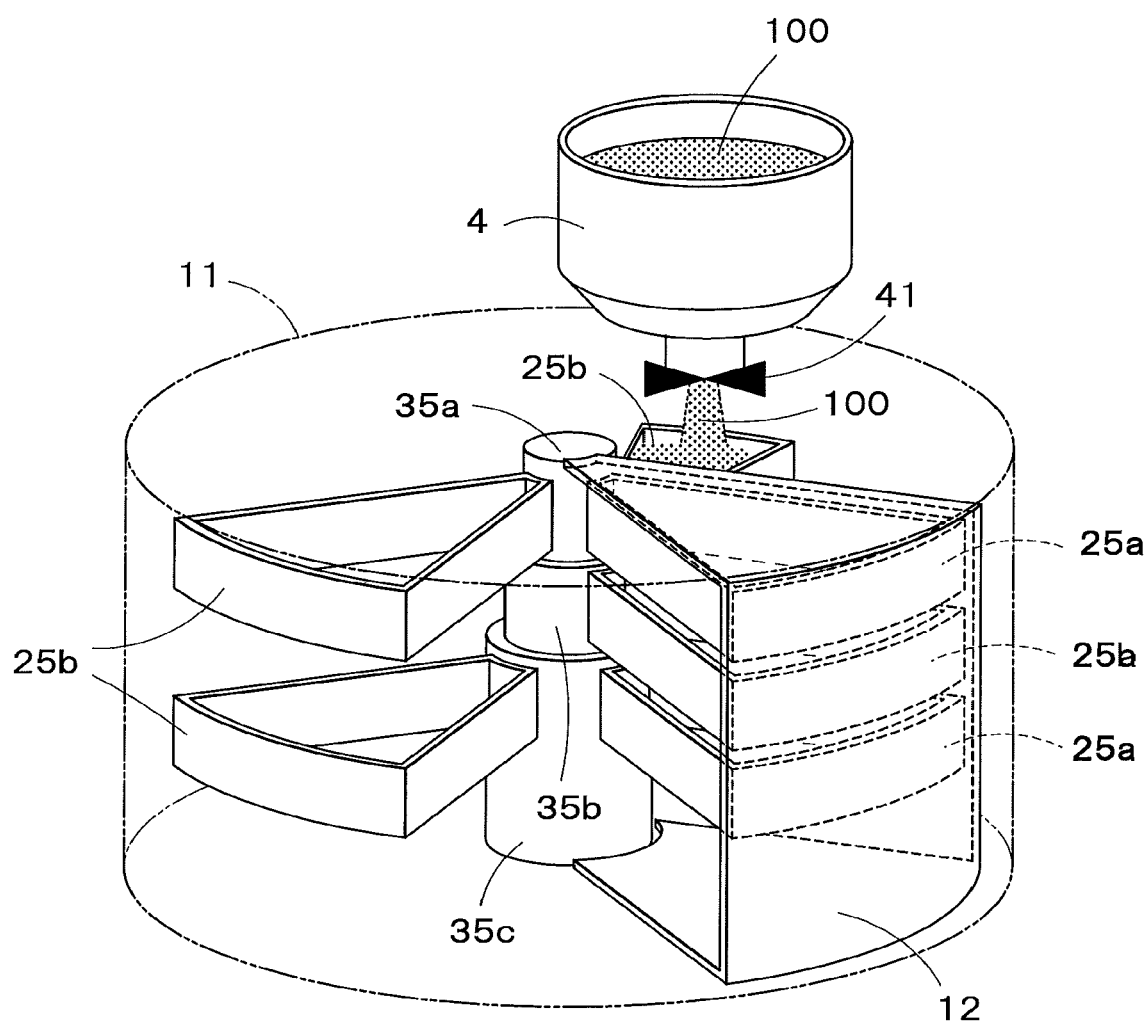
F I G. 11

VAPORIZATION SYSTEM

CROSS-REFERENCE TO RELATED APPLICATIONS

This application is based upon and claims the benefit of priority from Japanese Patent Application No. 2016-163976, filed on Aug. 24, 2016; the entire contents of which are incorporated herein by reference.

FIELD

Embodiments of the present invention relate to a vaporization system.

BACKGROUND OF THE INVENTION

A vaporization system which generates gas for film deposition includes a vaporizer. In a vaporizer, solid materials which contain, for example, halogenated metal (MX) are spread in a container. These solid materials decrease due to sublimation. Therefore, in such a vaporizer, an operation to replenish the solid materials is required. The operation of replenishing the solid materials is generally performed manually by replacing the whole container. Therefore, the vaporization system must be stopped for a long period of time when this operation takes much time.

BRIEF DESCRIPTION OF THE DRAWINGS

FIG. 2 shows a vaporizer shown in FIG. 1 from an opening face.

FIG. 3 shows a schematic configuration of a moving mechanism shown in FIG. 1.

FIG. 4 shows a schematic control configuration of a controller of the moving mechanism shown in FIG. 3.

FIG. 5 is a flow chart showing an operational procedure of automatically replenishing solid materials into a container.

FIG. 6 is a perspective view showing a state of replenishing the solid materials into the container.

FIG. 7 is a perspective view showing the container replenished with the solid materials being returned into the vaporizer.

FIG. 9 shows a schematically configuration of a vaporization system according to a second embodiment.

FIG. 10 shows a schematic configuration of a moving mechanism shown in FIG. 9.

FIG. 11 is a perspective view showing a state of replenishing solid materials into a container.

DETAILED DESCRIPTION OF THE INVENTION

Embodiments will now be explained with reference to the accompanying drawings. The present invention is not limited to the embodiments.

(The First Embodiment)

Figure 1:
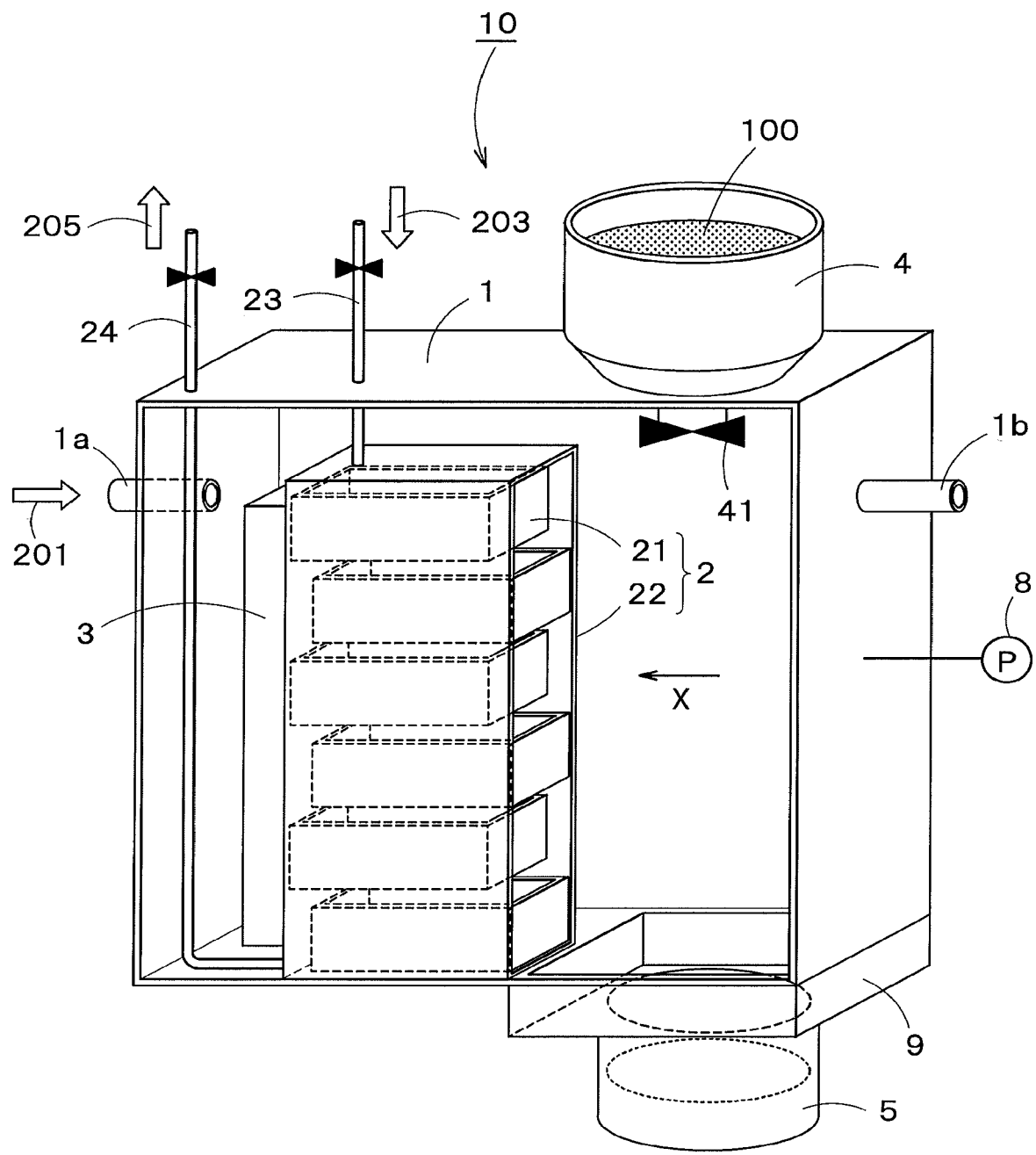
FIG. 1 is a perspective view showing a vaporization system according to a first embodiment.

FIG. 1 is a perspective view showing a vaporization system according to a first embodiment. As shown in FIG. 1, a vaporization system 10 according to the embodiment includes a body 1, a vaporizer 2, a moving mechanism 3, a supplier 4 and a collector 5.

The rectangular body 1 includes an inlet 1a and an outlet 1b. Into the body 1, an inert gas 201 is injected from the inlet 1a. By using, for example, a pump (not illustrated) to exhausting from outlet 1b, it is possible to create a vacuum state in the body 1. A pressure meter 8 is attached to the body 1 to monitor an internal pressure of the body 1.

The vaporizer 2 is in the body 1. The vaporizer 2 includes a plurality of containers 21 and a housing 22. Moreover, the vaporizer 2 is in communication with a pipe 23 and a pipe 24, respectively.

FIG. 2 shows the vaporizer 2 shown in FIG. 1 from an opening face (refer to arrow X in FIG. 1). As shown in FIG. 2, a plurality of the containers 21 are stacked in the housing 22. The powdered solid materials 100 are spread in each of the containers 21. The solid material 100 includes halogenated metal (MX), for example.

The solid materials 100 in each of the containers 21 are sublimated by heating the vaporizer 2. A sublimation gas 202 generated by sublimation is carried by a carrier inert gas 203 which is injected into the housing 22 through the pipe 23. A mixed gas 205 of the sublimation gas 202 and the carrier inert gas 203 is exhausted to the outside of the vaporization system 10 through the pipe 24.

In the embodiment, as shown in FIG. 2, a plurality of the containers 21 are alternately arranged from an upper part toward a bottom of the housing 22. This arrangement enables the sublimation gas 202 generated in each of the containers 21 to be carried by the carrier inert gas 203 from the upper part to the bottom of the housing 22. That is, a flow channel of the mixed gas 205 can be formed in the housing 22.

A light emitting element 6 and a light receiving element 7 are attached to an internal surface of each of the containers 21. The light emitting element 6 and the light receiving element 7 are an example of a sensor which detects a residue of the solid materials 100 in the plurality of the containers 21, respectively.

The light emitting element 6 and the light receiving element 7 are arranged to be opposed to each other to the internal surface of the container 21. When there are plenty of the solid materials 100 in the container 21, a light emitted from the light emitting element 6 is obstructed by the solid materials 100, and is not received at the light receiving element 7.

On the other hand, when a residue of the solid materials 100 is less than a predetermined quantity due to the generation of the sublimation gas 202, the light of the light emitting element 6 can be received at the light receiving element 7. In this way, the residue of the solid materials 100 in each of the containers 21 can be detected, on the basis of a light receiving state of the light receiving element 7.

Incidentally, a method to detect the residue of the solid materials 100 is not limited to such light sensors, but other sensors such as weight sensors may be employed.

FIG. 3 shows a schematic configuration of the moving mechanism 3. As shown in FIG. 3, the moving mechanism 3 includes a motor 31, a rotary shaft 32, a shaft 33, and a controller 34. The rotary shaft 32 and the shaft 33 are equivalent to a crank mechanism.

The motor 31 is driven based on a control of the controller 34. The rotary shaft 32 rotates by driving the motor 31. One end of the shaft 33 is connected with the rotary shaft 32, and the other end of the shaft 33 is connected with the container 21. The one end of the shaft 33 is connected in a position other than the center of the rotary shaft 32.

When the controller 34 drives the motor 31, the rotary shaft 32 rotates. This rotary motion is translated into a reciprocating linear motion of the container 21 by the shaft 33. Through this reciprocating linear motion, the container 21 can move between a first position located inside the housing 22, and a second position located outside of the housing 22.

FIG. 4 is a block diagram showing a schematic control configuration of the controller 34. As shown in FIG. 4, the controller 34 controls the motor 31 and a valve 41 on the basis of the light receiving state of the light receiving element 7.

The valve 41 is attached to the supplier 4 (refer to FIG. 1). The valve 41 can be switched to between an open state which enables the supply of the solid materials 100 from the supplier 4, and a close state which stops the supply of these solid materials 100.

Returning to FIG. 1, the supplier 4 is attached to an upper part of the body 1. That is, the supplier 4 is located above the vaporizer 2. The powdered solid materials 100 are stored in the supplier 4. When the container 21 moves to the second position described above and the valve 41 is switched from the close state to the open state, the solid materials 100 fall toward this container 21 from the supplier 4. In the embodiment, a plurality of containers 21 are stacked in the vaporizer 2, and move in the same direction between the first position and the second position. Therefore, the supplier 4 can supply the solid materials 100 commonly to all containers 21.

The collector 5 is opposed to the supplier 4 at a lower part of the vaporizer 2. A tray 9 is between the collector 5 and the body 1. When the supplier 4 supplies (drops) the solid materials 100 to the container 21, the tray 9 receives the solid materials 100 overflowing from this container 21. Then, the collector 5 collects the solid materials 100 via the tray 9.

In the embodiment, the collector 5 is replaceable with the supplier 4. That is, the shape of the collector 5 is the same as that of the supplier 4. Therefore, the solid materials 100 collected by collector 5 can be reused.

Hereinafter, referring to FIG. 5, operations of the vaporization system 10 mentioned above will be explained. FIG. 5 is a flow chart showing an operational procedure of automatically replenishing the solid materials 100 into the container 21.

First of all, the controller 34 determines, with respect to each of the containers 21, whether a residue of the solid materials 100 is less than the predetermined quantity or not (Step S11). In Step S11, when the light receiving element 7 receives the light of the light emitting element 6, the controller 34 determines that the residue of the solid materials 100 is less than the predetermined quantity.

Next, the controller 34 drives the motor 31 corresponding to the container 21 in which the residue of the solid materials 100 is less than the predetermined quantity. Consequently, the container 21 moves from the first position to the second position (Step S12). Subsequently, the valve 41 is switched from the close state to the open state on the basis of the control of the controller 34 (Step S13).

FIG. 6 is a perspective view showing a state of replenishing the solid materials 100 into the container 21. As shown in FIG. 6, when the valve 41 is in the open state, the solid materials 100 are replenished from the supplier 4 to the container 21. At this time, the controller 34 measures the time lapsed after switching the valve 41 to the open state,
and the controller 34 determines whether this lapsed time amounts to the predetermined time or not (Step S14). This predetermined time, as shown in FIG. 6, for example, is the time which is required for the container 21 to be filled with enough quantity of the solid materials 100 to obstruct the light from the light emitting element 6 toward the light receiving element 7.

When the lapsed time mentioned above amounts to the predetermined time, the controller 34 switches the valve 41 from the open state to the close state (Step S15). Consequently, the supply of the solid materials 100 from the supplier 4 to the container 21 is stopped.

FIG. 7 is a perspective view showing the container 21 replenished with the solid materials 100 being returned into the vaporizer 2. As shown in FIG. 7, after the valve 41 is switched to the close state, the controller 34 drives again the motor 31 which has been driven at Step S12. As a result, as shown in FIG. 7, this container 21 starts to return from the second position to the first position (Step S16).

During the move from the second position to the first position, the solid materials 100 overflowing from the container 21 are gathered in the tray 9, and are collected by the collector 5. The collected solid materials 100 are reused by replacing the collector 5 with the supplier 4.

According to the embodiment described above, when a residue of the solid materials 100 which are spread in the container 21 decreases, by the moving mechanism 3, this container 21 can move to the second position for supplying the solid materials 100. Moreover, after the supply of the solid materials 100 finishes, the container 21 can return to the vaporizer 2 by the moving mechanism 3. Therefore, the solid materials 100 can be automatically replenished. Thus, the time and effort for replenishing the material can be saved.

(The First Modified Example)

Figure 8A:
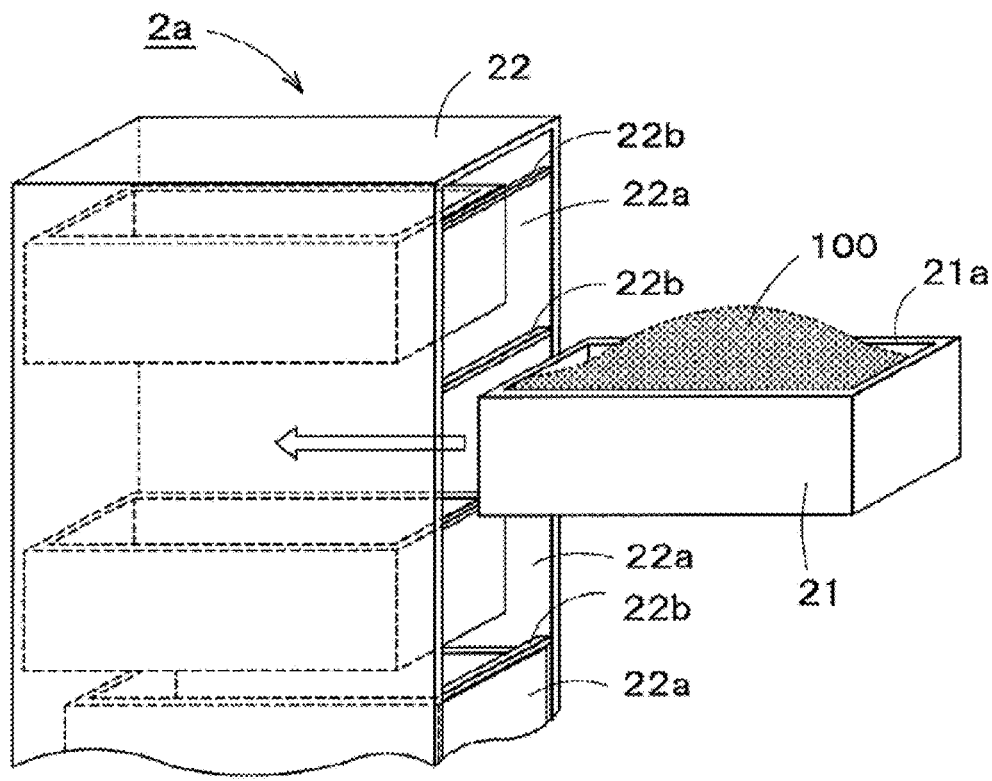
FIG. 8A is a perspective view showing a configuration of the vaporizer according to a first modified example.

FIG. 8A is a perspective view showing a configuration of a vaporizer according to a first modified example of the first embodiment. In a vaporizer 2a shown in FIG. 8A, an opening face of the housing 22 is divided into a plurality of openings 22a. A plurality of the containers 21 respectively pass through a plurality of openings 22a during moving between the first position and the second position. In the modified example, when each of the containers 21 passes through each of the openings 22a, upper-end opening faces 21a of each of the containers moves in parallel to upper edges 22b of each of the openings 22a.

Therefore, even if the solid materials 100 are piled in a mound form higher than the upper-end opening face 21a in the container 21 by the supplier 4, when this container 21 returns from the second position to the first position, the solid materials 100 is flattened in the container 21 by the upper edge 22b. As a result, the surface area of the solid materials 100 is kept constant in each of the containers 21. Thereby, the sublimation gas 202 can be evenly generated in each of the containers 21.

(The Second Modified Example)

Figure 8B:
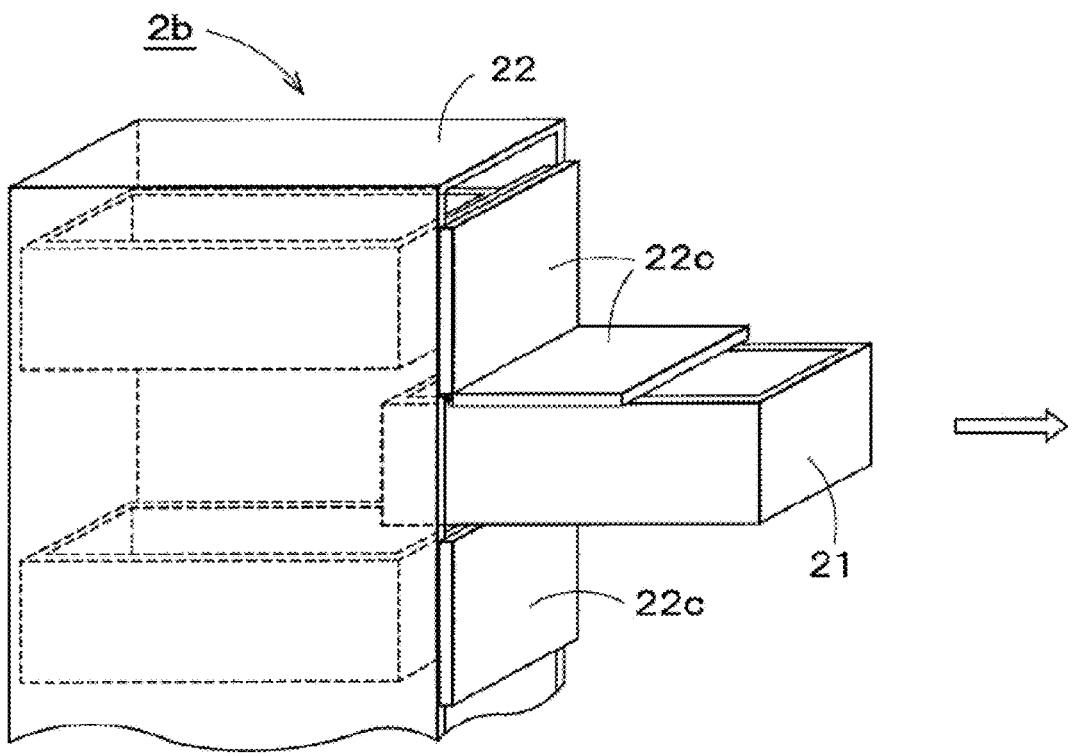
FIG. 8B is a perspective view showing a configuration of the vaporizer according to a second modified example.

FIG. 8B is a perspective view showing a configuration of a vaporizer according to a second modified example of the first embodiment. A vaporizer 2b shown in FIG. 8B includes a plurality of doors 22c which can cover and uncover each of the openings 22a mentioned above. Each of the doors 22c is rotatable in a direction of motion of the containers 21 and is attached to the upper edge 22b mentioned above.

According to the modified example, when the containers 21 are located in the vaporizer 2b, the doors 22c cover the openings 22a. Thereby, the sublimation gas 202 is less likely to leak out of the vaporizer 2b. Moreover, when the containers 21 are moved to the second position, the doors 22c are pushed by the containers 21 and rotate. Thereby the doors 22c do not obstruct the motion of the containers 21.

The Second Embodiment

FIG. 9 shows a schematically configuration of a vaporization system according to a second embodiment. Hereinafter, the elements similar to the vaporization system 10 according to the first embodiment described above are denoted by the same reference numerals and will not be described in detail here. As shown in FIG. 9, in a vaporization system 20 according to the embodiment, a vaporizer 12 and a moving mechanism 13 are housed in a cylindrical body 11.

Although not indicated in FIG. 9, similar to the body 1 of the first embodiment, the body 11 also includes the inlet 1a and the outlet 1b, and the pressure meter 8 is attached to the body 11. Also, similar to the vaporizer 2 of the first embodiment, the vaporizer 12 is in communication with the pipe 23 and the pipe 24, respectively.

A plurality of containers 25a are housed in the vaporizer 12. Moreover, a plurality of containers 25b are arranged outside the vaporizer 12. The solid materials 100 (not shown in FIG. 9) have been stored in advance in each of the containers 25b. Hereby, each of the containers 25a is equivalent to a first container, and each of the containers 25b is equivalent to a second container.

In the embodiment, the container 25a and the container 25b are sector shaped in a plane view. Each tip of the container 25a and the container 25b is connected with the moving mechanism 13.

FIG. 10 shows a schematic configuration of the moving mechanism 13. As shown in FIG. 10, the moving mechanism 13 includes a plurality of rotary shafts 35a, 35b and 35c, a plurality of motors 36a, 36b and 36c, and a controller 37.

The rotary shafts 35a, 35b and 35c are the coaxial shafts. One container 25a and one container 25b are connected with each of the rotary shafts (refer to FIG. 9). Incidentally, a plurality of the containers 25b may be connected with each of the rotary shafts. In this embodiment, three rotary shafts are provided. However, the number of the rotary shafts may be two or more than three.

The motors 36a, 36b and 36c rotate the rotary shafts 35a, 35b and 35c, independently and respectively, on the basis of the control of the controller 37. In this embodiment, the number of motors corresponds to the number of the rotary shafts.

The controller 37 controls the motors 36a, 36b and 36c on the basis of the light receiving state of the light receiving element 7, similar to the controller 34 of the first embodiment. At this time, the controller 37 also controls the valve 41.

Hereinafter, an operation of the vaporization system 20 mentioned above will be briefly explained. Here, the explanation will focus on the differences from the first embodiment.

For example, when a residue of the solid materials 100 is less than the predetermined quantity, in the container 25a connected with the rotary shaft 35b, the controller 37 drives the motor 36b. By the drive of the motor 36b, this container 25a moves from the first position to the second position.

The container 25b is connected with the rotary shaft 35b at a third position which is behind the container 25a mentioned above with respect to a rotary direction R. Moreover, a rotary quantity of the container 25a from the first position to the second position is equal to that of the container 25b from the third position to the first position. Thus, an angle of rotation when the container 25a rotates from the first position to the second position is equal to that when the container 25b rotates from the third position to the first position. Therefore, the container 25a moves to the second position and the container 25b moves to the first position at the same time. The controller 37 thereafter switches the valve 41 from the close state to the open state.

FIG. 11 is a perspective view showing a state of replenishing the solid materials 100 into the container. As shown in FIG. 11, when the valve 41 is in the open state, the solid materials 100 are replenished into the container 25a from the supplier 4. At this time, in the vaporizer 12, this container 25a is replaced with the container 25b filled with the solid materials 100. Therefore, the replenishing and the sublimation of the solid materials 100 can be simultaneously performed.

Then, when the lapsed time after switching the valve 41 to the open state amounts to the predetermined time, the controller 37 switches the valve 41 from the open state to the close state. Thereby, the supplying of the solid materials 100 is stopped.

When a residue of the solid materials 100 of the container 25a connected with the rotary shaft 35a or the rotary shaft 35c decreases, a series of operations mentioned above are performed. Furthermore, when a residue of the solid materials 100 is less than the predetermined quantity in the container 25b which moved to the vaporizer 12, this container 25b, similarly to the container 25a, also moves to the second position.

According to the embodiment described above, as with the first embodiment, when a residue of the solid materials 100 which are spread in the container 25a decreases, this container 25a can, by the moving mechanism 13, move to the second position for the supplying of the solid materials 100. In this way, since the replenishing of the solid materials 100 is performed automatically, the time and effort for replenishing the material can be saved.

Furthermore, in this embodiment, the container 25b in which the solid materials 100 are stored in advance moves to the first position at the same time as the container 25a moves to the second position. Therefore, even while the supplier 4 supplies the solid materials 100 to the container 25a, the solid materials 100 can be sublimated in the vaporizer 12. Therefore, the operating rate of the vaporizer 12 can be improved.

Hereby, the collector 5 and the tray 9 may be provided in the vaporization system 20 of this embodiment similarly to the first embodiment. In this case, the wasting of the solid materials 100 can be reduced by replacing the collector 5 with the supplier 4. Moreover, the doors 22c mentioned above may be included in the vaporizer 12. In this case, the sublimation gas created in the vaporizer 12 is less likely to leak.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A vaporization system comprising:
a vaporizer including a plurality of containers that are configured to store powdered solid materials;
a body in a vacuum state that is configured to house the vaporizer, wherein the body is rectangular and includes an inlet into which an inert gas is injected, an outlet, and a pressure meter to monitor an internal pressure of the body;
a sensor configured to detect a residue of the solid materials stored in the plurality of containers respectively;
a moving mechanism configured to move the plurality of containers respectively between a first position located inside the vaporizer and a second position located outside of the vaporizer based on a detection result of the sensor;
a supplier dropping and supplying the solid materials to a container located in the second position among the plurality of containers;
a valve that is configured to be switched between an open state that supplies the solid materials from the supplier and a close state that stops supply of the solid materials from the supplier;
a collector that is opposed to the supplier at a lower part of the vaporizer and that is configured to collect the solid materials;
a tray disposed between the collector and the body, wherein the tray is configured to receive any portion of the solid materials overflowing from the plurality of containers when the supplier supplies the solid materials to the plurality of containers;
wherein the vaporizer is coupled to a first pipe and a second pipe, a sublimation gas sublimated by heating the vaporizer is carried by a carrier inert gas that is injected into a housing of the vaporizer through the first pipe, and the sublimation gas and the carrier inert gas are exhausted outside of the vaporization system through the second pipe;
wherein the plurality of containers are alternately arranged from an upper part of the housing toward a bottom part of the housing, wherein a space is formed between an internal surface of the housing and an external surface of each of the containers in a direction perpendicular to a motion direction of the containers and a vertical direction, and the space forms a flow channel of a mixed gas in the vertical direction;
wherein the sensor includes a light emitting element and a light receiving element that are arranged opposite to each other on an internal surface of each of the containers, and when an amount of the solid materials in a respective one of the containers is equal to or greater than a threshold amount, a light emitted from the light emitting element is obstructed by the solid materials and is not received at the light receiving element, and when the amount of the solid materials is less than the threshold amount, the light emitted from the light emitting element is received at the light receiving element;
wherein the moving mechanism is configured to move a first one of the containers in which the amount of the solid materials is less than the threshold amount from the first position to the second position, and subsequently move the first one of the containers from the second position to the first position when a predetermined time elapses;
wherein the plurality of containers are stacked in the vaporizer and are configured to respectively move in the same direction between the first position and the second position, and the supplier is arranged in an upper part of the body;
wherein the housing includes a plurality of openings through which the plurality of containers respectively pass during moving between the first position and the second position, and an upper-end opening face of the plurality of containers moves in parallel to an upper edge of each of the openings;
wherein a cylindrical part of a shape of the collector is the same as that of the supplier such that the collector and the supplier are interchangeable;
wherein the moving mechanism includes a motor, a rotary shaft, a shaft, and a controller, wherein the motor is driven based on a control of the controller, and the rotary shaft rotates by driving the motor, and one end of the shaft is connected with the rotary shaft at a position other than a center of the rotary shaft and the other end of the shaft is connected with the container, and the rotary shaft and the shaft constitute a plurality of crank mechanisms that linearly reciprocate the plurality of containers in the same direction respectively between the first position and the second position, and the controller controls the plurality of crank mechanisms based on the detection result of the sensor;
wherein the controller is configured to switch the valve to the open state when the container moves to the second position, and switch the valve to the close state when the predetermined time elapses; and
wherein the vaporizer further includes a plurality of doors that are configured to cover and uncover each of the openings and each of the doors is attached to the upper edge of each of the openings and is rotatable from a vertical position to a horizontal position around a pivot point at the upper edge in an upward and outward direction from the vaporizer based on an outward motion of each respective one of the containers from the vaporizer such that when the solid materials form a mound that is higher than the uper-end opening face of the respective container, the mound is flattened by the respective door in the horizontal position.

2. The vaporization system according to claim 1, wherein each of the plurality of containers has a shape of a right rectangular tray having a side that includes the external surface that forms the space with the internal surface of the housing.

3. The vaporization system according to claim 2, wherein the space formed between the external surface of each respective one of the plurality of containers and the internal surface of the housing has a shape of a second right rectangular volume.

4. The vaporization system according to claim 2, wherein each of the plurality of containers is linearly reciprocated by a respective one of the plurality of crank mechanisms in a direction parallel to a surface of at least one side of the shape of each respective one of the plurality of containers.

* * * * *